(12) United States Patent
Zoldi et al.

(10) Patent No.: US 9,194,899 B2
(45) Date of Patent: Nov. 24, 2015

(54) UTILITY NETWORK AND REVENUE ASSURANCE

(75) Inventors: Scott M. Zoldi, San Diego, CA (US); Julie A. Haag, San Diego, CA (US)

(73) Assignee: FAIR ISAAC CORPORATION, San Jose, CA (US)

( * ) Notice: Subject to any disclaimer, the term of this patent is extended or adjusted under 35 U.S.C. 154(b) by 1010 days.

(21) Appl. No.: 11/838,185

(22) Filed: Aug. 13, 2007

(65) Prior Publication Data

US 2009/0045976 A1    Feb. 19, 2009

(51) Int. Cl.
| | |
|---|---|
| G01R 22/10 | (2006.01) |
| G01R 22/06 | (2006.01) |
| G01D 4/00 | (2006.01) |
| G08B 21/04 | (2006.01) |

(52) U.S. Cl.
CPC .............. *G01R 22/10* (2013.01); *G01D 4/004* (2013.01); *G01R 22/066* (2013.01); *G08B 21/0484* (2013.01); *G01R 22/063* (2013.01); *Y02B 90/242* (2013.01); *Y02B 90/246* (2013.01); *Y04S 20/322* (2013.01); *Y04S 20/42* (2013.01)

(58) Field of Classification Search
CPC .. G01R 22/061; G01R 22/063; G01R 22/066; G01R 22/068; G01D 4/002; G01D 4/004; G01D 4/14; G01D 4/16; G01D 4/18; H04B 3/54; H04B 3/542; H04B 3/544; H04B 3/546; H04B 3/548
USPC ................. 705/412, 63; 340/870.01–870.06; 702/1, 62, 85, 100, 179, 61; 235/435, 235/437; 700/22, 266, 90, 275, 286, 291
See application file for complete search history.

(56) References Cited

U.S. PATENT DOCUMENTS

| | | | | |
|---|---|---|---|---|
| 5,696,501 | A  * | 12/1997 | Ouellette et al. | 340/870.02 |
| 6,263,055 | B1 * | 7/2001 | Garland et al. | 379/106.05 |
| 7,327,998 | B2 * | 2/2008 | Kumar et al. | 455/405 |
| 7,436,321 | B2 * | 10/2008 | White et al. | 340/870.02 |
| 7,552,033 | B1 * | 6/2009 | Culp et al. | 703/2 |
| 7,853,417 | B2 * | 12/2010 | Vaswani et al. | 702/60 |
| 2006/0085370 | A1 * | 4/2006 | Groat et al. | 707/1 |
| 2007/0247331 | A1 * | 10/2007 | Angelis et al. | 340/870.02 |
| 2008/0109387 | A1 * | 5/2008 | Deaver et al. | 705/412 |

OTHER PUBLICATIONS

Author: J.R Galvan, A. Elices, A. Muños, T. Czernichow, and M.A. Sanz-Bobi Title: System for Detection of Abnormalities and Fraud in Customer Consumption Date: Nov. 2, 1998 Publisher: 12th Conference on the Electric Power Supply Industry.*

Author: Fortnightly Magazine Magazine Name: Spark Letter #: 30 Title: A New Take on Energy Theft Detection Date: Jun. 2006.*

(Continued)

*Primary Examiner* — Hai Phan
*Assistant Examiner* — Franklin Balseca
(74) *Attorney, Agent, or Firm* — Mintz Levin Cohn Ferris Glovsky and Popeo, P.C.

(57) ABSTRACT

A system and method for detecting anomalies in the measurement and distribution of utilities is disclosed. Utility metering data obtained at a utility meter is received through a communications network. A utility consumption associated with an entity is then measured based on the utility metering data. The utility consumption can then be monitored for anomalies based on entity profile characteristics associated with the entity. The utility analytics system and method can be applied to the electrical utility industry, but also applicable to gas and water distribution, and other utilities.

21 Claims, 7 Drawing Sheets

(56) References Cited

OTHER PUBLICATIONS

Author: J.R Galvan, A Elices, A. Munos, T. Czernichow, and M.A Sanz-Bobi Title: System for Detection of Abnormalities and Fraud Customer Consumption Date: Nov. 2, 1998 Publisher: 12th Conference on the Electric Power Suply Industry.*

Author: Fortnighly Magazine Magazine Name: Spark Letter#: 30 Title: A New Take on Energy Theft Detection Date: Jun. 2006.*

Author: JR Galvan, A. Elices, A. Munos, T Czernichow, and M.A. Sanz-Bobi Title: System for detection of abnormalities and fraud consumption Date: Nov. 2, 1998 Publisher: 12th Conference on the Electric Power Supply Industry.*

Author: JR Galvan, A. Elices, A. Munos, T Czernichow, and M.A. Sanz-Bobi Title: System for detection of abnormalities and U fraud consumption Date: Nov. 2, 1998 Publisher: 12th Conference on the Electric Power Supply Industry.*

Author: JR Galvan, A. Elices, A. Munos, T Czernichow, and M.A. Sanz-Bobi Title: System for detection of abnormalities and fraud in customer consumption Date: Nov. 2, 1998, Publisher: 12th Conference on the Electric Power Supply Industry.*

* cited by examiner

UTILITY NETWORK AND REVENUE ASSURANCE

BACKGROUND

This disclosure relates generally to detecting anomalies in the measurement and distribution of utilities.

Increasingly, the utilities industry is moving to a model where metering is becoming automated which enables more accurate and timely measurement of consumption of the utilities by end customers. Typically these meters provide measurements of consumption and a wireless communication capability to broadcast utility consumption when polled. Although new solid state devices are more accurate than electric-mechanical meters, there are a variety of new vulnerabilities that impact the reliability of the meter. Further, physical access to the meter is not always possible and it is difficult to validate consumption patterns.

In these cases, advanced analytics can be utilized to compare changes in consumption within the customer and across customers to determine abnormalities in usage. Metering issues can be grouped into three broad categories meter live abuse, meter failure, and meter bypass/fraud. Another category, zero use can be generally mapped directly to meter failure or meter bypass/fraud and is thus assigned a subcategory under these broad assessments.

Meter live abuse is a straight forward situation detected where a meter shows usage when the formal billing relationship with the customer has ceased. A common situational example of this occurrence can be seen when a tenant vacates a property and shortly afterward an electrical draw is seen at the property. When meter live abuse is detected, there is a return on investment calculation needed to decide whether a field representative should physically shut power off to the property, whether they should engage the new tenant and conduct the research necessary to backbill the use or whether it is anticipated that the new tenant will soon contact the utility company to establish a billing relationship. In cases of residential meter live abuse, it is often difficult for a utility to prove the relationship and thus backbilling is rarely seen in practice. In commercial relationships, depending on regulatory issues, backbilling is often done up to a span of multiple years.

Meter failure can constitute meters that no longer measure consumption accurately or have a systematic inaccuracy. Some meter failures are a consequence of the age of the meter. Meter failure rates can be particularly high with electromechanical meters, but even solid state meters can suffer damage that impacts the ability for the meter to correctly measure electricity consumption. The main goal is to determine whether a fluctuation in energy consumption is a normal variation in a properties' usage, related to an explained event such as a period of vacation, or whether there are usage characteristics that point to higher likelihood that the meter is not working properly, such as violating minimum draw calculations in the case of zero use readings or measuring fluctuations that are not consistent with typical variations in the history of measurements associated with the meter.

Meter by-pass/fraud is a more sinister phenomenon where a meter is being bypassed, broken or tampered with to measure a fraction of the consumption or force no reading of electrical consumption. In electrical energy distribution this could involve running jumpers around the meter to bypass the meter for a period of time, or it could involve removal of the meter. While the general utility industry move from mechanical to solid state meters has resulted in less tampering, the issue still persists. Many modern meters, such as energy and demand meters, contain sensors that can point to tampering; these are known as tamper codes. While not all meters contain these codes, where they exist, they provide valuable data to identify bypass and fraud. Monitoring the tamper codes in relation to fluctuation of consumption can be a strong identifying component to determine suspected fraud. Another major component is monitoring consumption patterns compared with consumption history at the property as well as the consumption of like residences or businesses. These comparisons help determine whether such consumption patterns are explainable.

Non-metering is another phenomenon that is difficult to detect without monitoring typical network distribution characteristics. An example could include setting up a separate circuit for a pool at a residence but not getting the line metered. Typically this is the result of contractors not getting appropriate permits and setting up illegal circuits. Since there is no measurement of the consumption, these are likely best measured by determining what circuits in the electrical distribution network have large unexplained line leakage or increases or decreases in consumption.

Another factor to consider in revenue assurance is network failure. Network failure has revenue impacts due to the inability to provide and thus bill for service when the network is down. Beyond billing concerns, network failure can also lead to customer churn as customers may leave the utility company where a failure was experienced to join another company with perceived higher reliability. In addition to the revenue impacts to utility companies through quality of service, network failure can in some instances result in public safety issues given that many households demand on reliable service to heat or cool their homes during dangerously high temperatures, or to run critical medical equipment, the interruption of which can be life-threatening.

Determining network failure is extremely important to ensure proper quality of service and personal safety. There are a variety of issues that can lead to network failure including non-metered circuits, transformer age/failure, and peak times of electrical demand. Transformers tend to overheat during periods of high-temperature increasing the probability of failure, this coupled with the direct relationship between energy consumption and temperature fluctuations across the portions of the electrical network can create an increased risk of massive failure. Detecting changes in demand can enable redistribution of utilities or equipment upgrades to prevent a network failure. In situations where meters have aged or may be undersized, prediction of likely failures can help prevent the instances and extent of network failures. The need for a utility company to predict network failure is extremely important to the stability of their business.

SUMMARY

In general, this document discusses a system and method for detecting anomalies in the measurement and distribution of utilities. The description below will focus on the electrical utility industry, but the analytic design also applies to gas and water distribution.

Utility analytics is designed to monitor revenue leakage and network performance issues associated with utility distribution systems. The techniques described in this document highlight analytic techniques related to electric, gas, and water distribution systems. The techniques focus on meter-tampering, meter-fraud and meter-failure associated with revenue leakage and network distribution failure forecasting. This utility analytic system is designed to monitor in real-time data coming from automatic meter reading (AMR)

enabled meters to provide real-time detection of revenue assurance issues or distribution network issues. As the utilities industry is more widely accepting AMR data as part of the Automatic Metering Infrastructure (AMI), an increased need is emerging for analytics to isolate patterns in the massive amounts of data that will be collected from the distribution network. Utility Analytics is an analytic infrastructure designed to find patterns of revenue leakage and network anomalies in real-time to assure revenue and ensure the quality of service provided to the end customer.

In one aspect, a computer-implemented method for detecting anomalies of a utility distribution system includes the steps of receiving, through a communications network, utility metering data obtained at a utility meter, and measuring a utility consumption associated with an entity based on the utility metering data. The method further includes the step of monitoring the utility consumption for anomalies based on entity profile characteristics associated with the entity.

In another aspect, an utility analytics system includes an analytics computer adapted to receive utility metering data obtained at a utility meter. The analytics computer is adapted to measure a utility consumption associated with an entity based on the utility metering data, and to monitor the utility consumption for anomalies based on entity profile characteristics associated with the entity.

In yet another example, a method for detecting anomalies of a utility system includes the steps of monitoring utility metering data obtained at one or more utility meters, and transmitting the utility metering data through a network to an analytics computer. The method further includes the step of generating, using the analytics computer, utility consumption data patterns for one or more entities based on the utility metering data.

The details of one or more embodiments are set forth in the accompanying drawings and the description below. Other features and advantages will be apparent from the description and drawings, and from the claims.

BRIEF DESCRIPTION OF THE DRAWINGS

These and other aspects will now be described in detail with reference to the following drawings.

Like reference symbols in the various drawings indicate like elements.

DETAILED DESCRIPTION

This document describes a utility analytics system and method that is designed to monitor revenue leakage and network issues associated with utility distribution systems. The utility analytics system utilizes profiling and definition of peer groups of like entities to determine whether or not the usage associated with a particular entity is abnormal based on the distribution of load characteristics associated with the entities. The utility analytics system is configured to be a real-time monitoring system based on data collected through automatic meter read (AMR) enabled meters to support an Automatic Metering Infrastructure (AMI). The ability to predict areas of revenue leakage and network failure in real-time allows for timely investigation and resolution of revenue assurance and network issues to protect revenue and quality of service delivered to the end consumer.

Figure 1:
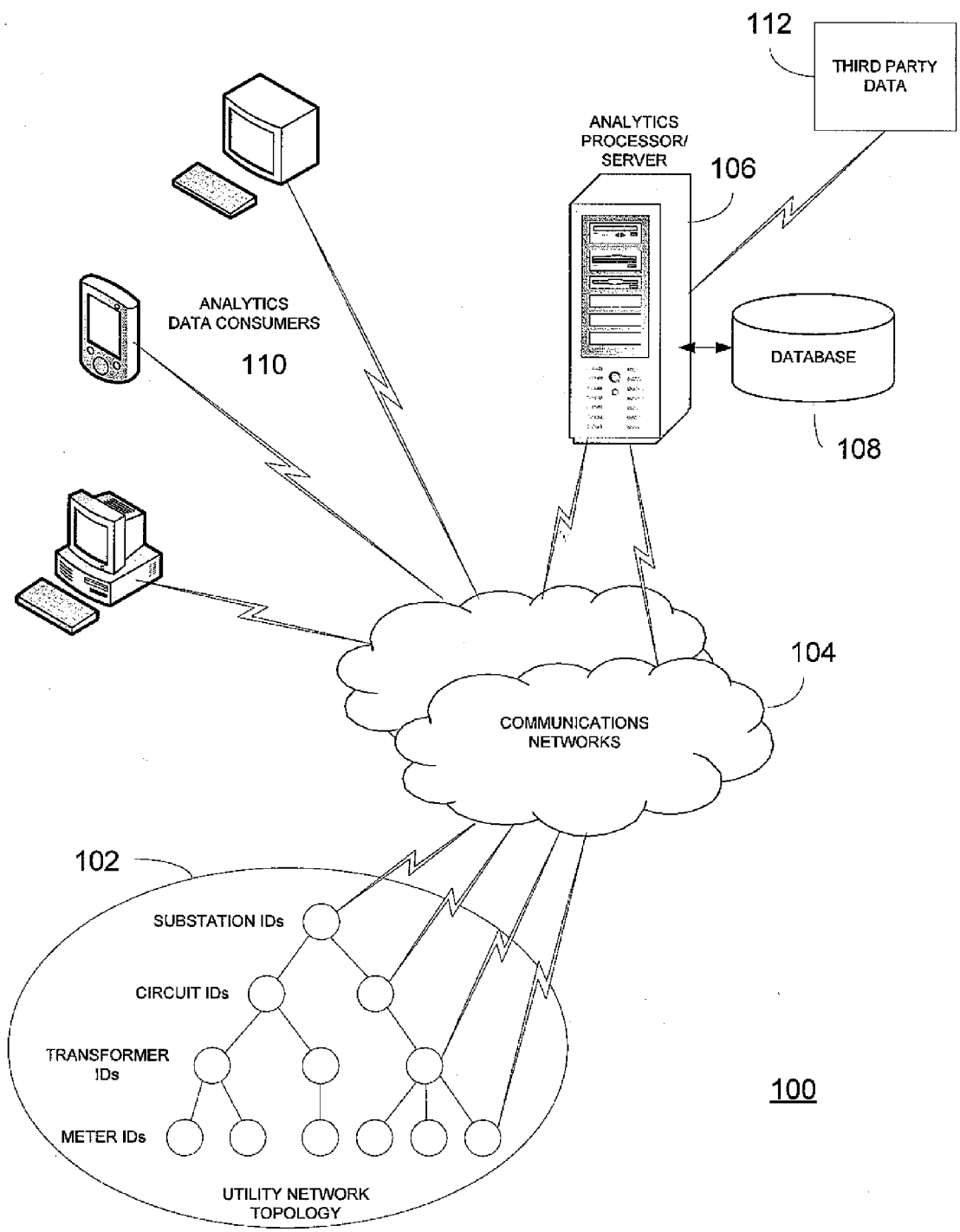
FIG. 1 illustrates a utility analytics system.

FIG. 1 illustrates a utility analytics system 100, in which a number of AMR-enabled meters within a utility network topology 102 transmit metering data through a communications network to an analytics processor/server 106. The analytics processor/server 106 stores the acquired metering data in a database 108 and, using previously-gathered information in the database 108 related to entities in the utility network topology, analyzes the metering data for utility consumption patterns and measurements to detect anomalies in the measurement, distribution and usage of utility resources by the entities. Information in the database 108 and/or processed by the analytics processor/server 106 can also be provided by a third party data source 112. Results generated by the analytics processor/server 106 can be transmitted to any of a number of analytics data consumers 110.

The entities in the utility network topology 102 can be property, residences, businesses, structures, or subdivisions of structures such as apartments, condominiums, or tenant space in a multi-tenant building. The entities can also include utility distribution nodes such as substations, circuits, transformers, and other distribution nodes. The communications networks 104 can be any data communications network and can include, without limitation, the Internet, one or more Intranets, Wide Area Networks, wireless networks, high-speed wired networks, etc. The analytics processor/server 106 can be any type of computing system, as described further below, operating specialized analytics software according to the methods and processes described herein. The analytics data consumers 110 represent any information consumers such as utility providers, governmental or regulatory agencies, financial institutions, and/or private enterprises, as well as their computing systems for receiving, processing and displaying representations of the analytics results.

There are a variety of data sources available to utilities companies. For the detection of network and distribution anomalies, the main data sources for the utility analytics include AMR reads of meters and network elements. Also used are the network hierarchy, meter and transformer characteristics, and entity characteristics based on publicly available data.

Using electric utility distribution as an example, AMR data reads are used to provide the measurements of utility consumption associated with an electrical power circuit. This can occur at meters associated with the entity, but can also occur on links in the utility network or on particular substations and circuits that distribute the power. The data collected from AMR reads varies by meter and customer, but typically consists of summarized monthly information that contains overall consumption and peak demand figures or time of use data which measures demand at a much finer granularity. Whether general monthly data or granular time of use data, both measurements of demand are beneficial to derive patterns of use.

Network topology data is used to determine possible network faults associated with increased demands on various circuits. This data will typically encompass the association of meter IDs to transformer IDs to circuits IDs and finally to substation IDs. The utility network topology 102 can and will change from time to time based on demands and power drawn from external power sources. Circuits can be fed by different substations, thus based on this and how the topology may change, analytic variables in the utility analytics system can be preferably based on normalized loads. Network characteristics are another component of network monitoring that is used, as the failure rate and properties of the various network components assist in understanding responses to increased demand or switching.

Yet another relevant data source is entity profile characteristics, much of which is available via public record. This data can provide valuable information for peer analysis of consumption across different entities. Using property as an example, relevant entity profile characteristics includes data such as postal codes, property size/square footage, number of bedrooms, whether the property includes an existing pool, standard industry codes (for businesses) and other data concerning the property. Entity profile characteristics are used for determining, based on peer analysis of like properties, via peer profiles and groupings whether consumption or changes in consumption of a utility are truly abnormal and quantify the severity of the anomaly.

Figure 2:
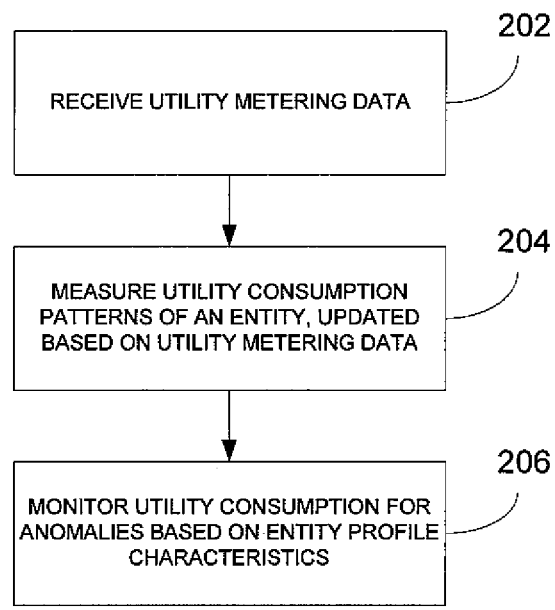
FIG. 2 is a process flow diagram of a method for analyzing a utility.

FIG. 2 is a process flow diagram of a method 200 for analyzing a utility. In general, at 202 metering data is received by a analytics processor/server, preferably via a communications network. The metering data is preferably obtained by a meter associated with an entity such as a property, structure, building, residence, etc., and in an exemplary implementation is gathered by automatic meter reading technology. At 204, utility consumption patterns of the entity are measured for and updated based on the utility metering data. At 206, the utility consumption, such as levels, variances, or even absence of such consumption, is monitored and processed to detect for anomalies in the consumption, distribution, or measurement of the utility related to the entity. Such monitoring is also based on the entity profile characteristics as described in general above.

Figure 3:
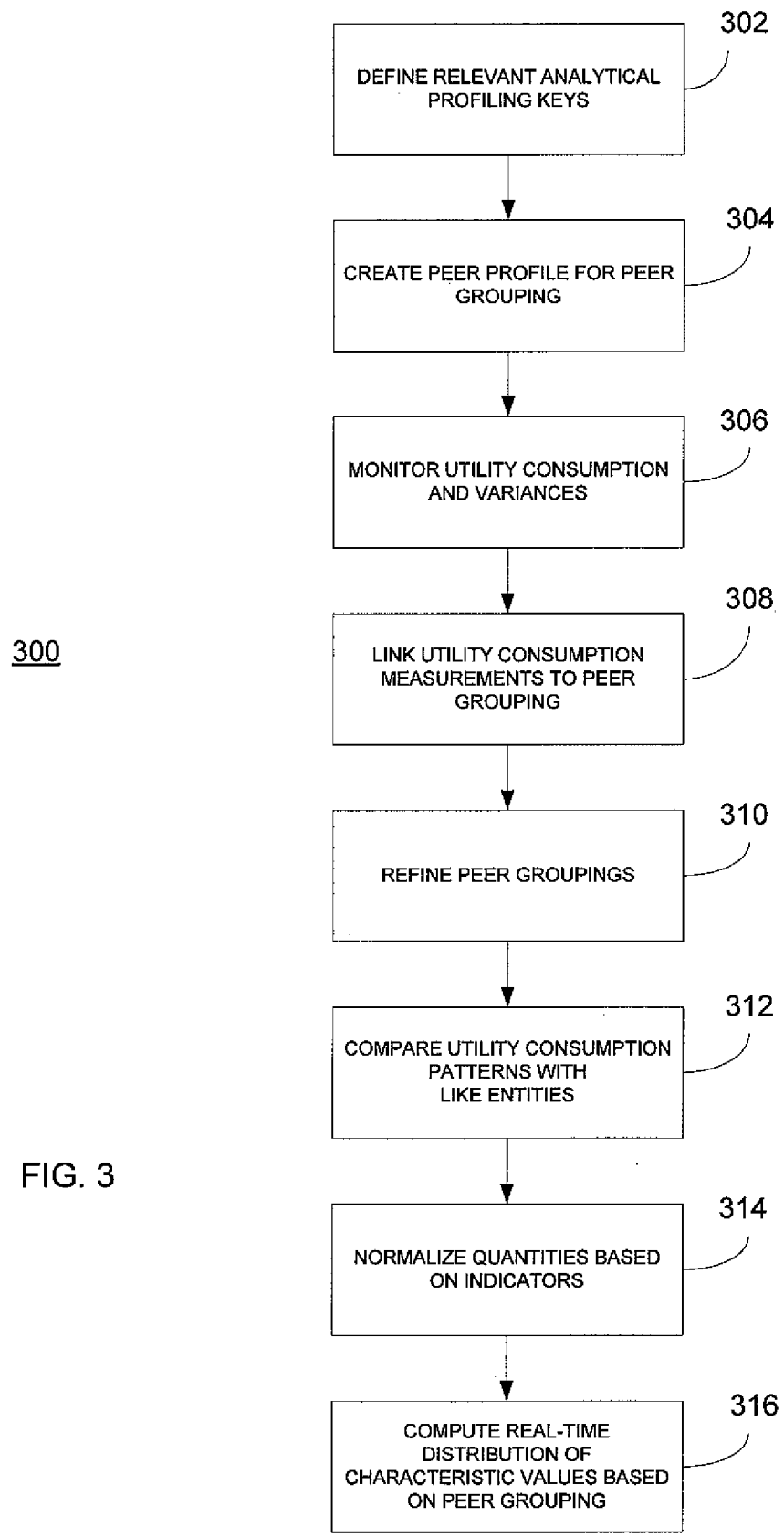
FIG. 3 is a process flow diagram of a method for analyzing utility data.

FIG. 3 is a process flow diagram of a method 300 for analyzing utility data. At 302, relevant analytical profiling keys are defined for one or more entities, and at 304 peer profiles are created for peer grouping of like entities. At 306, utility consumption, which can include consumption variances based on an historical record, is monitored for the one or more entities, and at 308 utility consumption measurements are linked to the peer groupings. At 310, the peer groupings are refined based on any new information or improved weighting algorithms, and at 312 utility consumption patterns that are established for the one or more entities are compared with like entities, based at least in part on the peer profiles and refined peer groupings. At 314, the quantities that are obtained from the meters and/or monitored by a processing/analytical system are normalized 314 based on one or more established indicators. At 316, a real-time distribution of characteristic values is computed based on peer groupings. The information generated by the method 300 can then be used to detect anomalies or other issues with the distribution, consumption and management of a utility with respect to one or more entities, or groups of entities, that consume the utility. These steps will now be further described in detail.

An initial step in monitoring abnormalities in utility consumption at an entity is to define the relevant analytic profiling keys on which the consumption will be monitored to detect abnormalities based on historical consumption patterns. When monitoring a entity such as a residence, for example, there are two relevant monitoring levels, the service address and the meterID. The monitoring at the specific service address level provides a view into all consumption associated with the residence, whereas the meter monitoring will provide a view when there is more than one meter servicing a residence.

Figure 4:
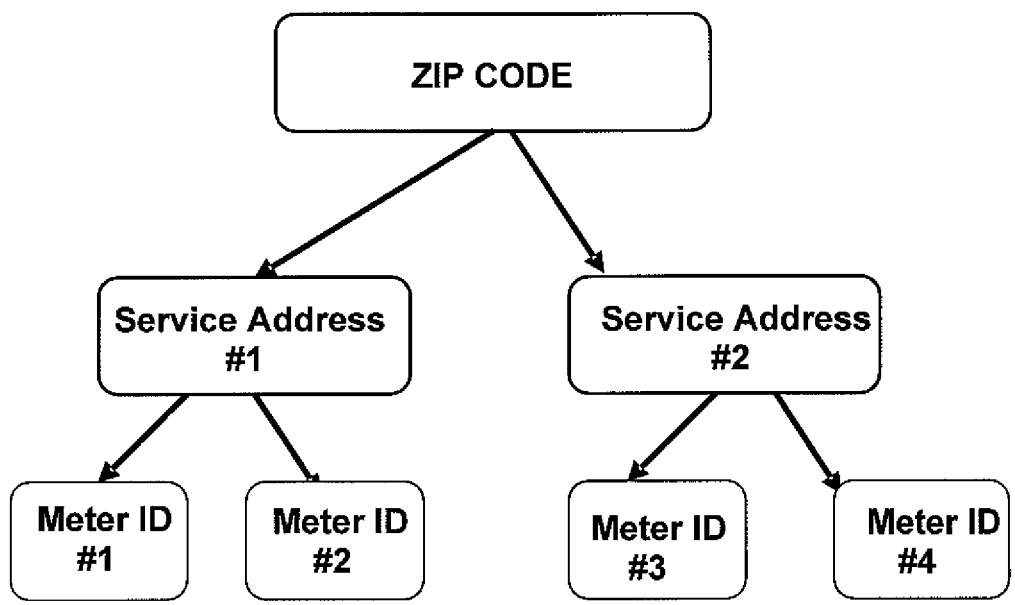
FIG. 4 is a block diagram of a residential profile monitoring hierarchy.

In addition to entity monitoring, variations in utility consumption associated with entities in a similar geographic area can be monitored. A profile associated with the postal code can be created to provide views into variations in consumption associated with fluctuations based on weather patterns, daylight savings time, or affluence of a particular neighborhood. FIG. 4 is a block diagram of a residential profile monitoring hierarchy, illustrates the relevant entities for monitoring consumption patterns for suspected instances of revenue leakage, meter tampering/fraud, and meter failure.

As an example, based on profiling consumption patterns associated with the analytic hierarchical structure shown in FIG. 4, consumption is measured primarily at the residence level. This monitoring will provide details of whether any changes in consumption are relevant based on the history of consumption measurements. The linkage to the ZIP code profile provides the ability to measure fluctuations in consumption across all service addresses associated with the ZIP code. The ZIP code profile will enable a real-time estimate of the distributions of consumption characteristics across the associated residences and provide estimates of what quantile, or other predetermined segment of a group, a particular residence falls based on real-time estimates of the distributions of the different consumption characteristics. For example, a residence may read 100 KWH which is a 70% drop from the prior two months, by aggregating at the ZIP code profile one may determine that 100 KWH is at the 15% quantile of consumption for all residences in the ZIP code which points to higher risk. Further, the ZIP code profile can indicate that on average residences experienced a 23% increase in consumption this month which would make the 70% drop in consumption at the suspect residence even more suspicious. The above example of peer analysis illustrates how distributions of consumption characteristics quantify the severity of an abnormality that can reflect revenue leakage issues at the residence.

Publicly available entity profile characteristics, such as residence features, are used to further refine peer groupings within the geographic area. For example, some homes will be older construction and likely less energy efficient. Other homes may have a pool or air conditioning which will increase consumption related to those residences and the variation in consumption over the year. Further, it is desirable to estimate the occupancy of the household to understand consumption per occupant, and the general size of the residence to quantify natural changes in heating needs. Table 1 below contains examples of common features associated with the residence.

TABLE 1

| Indicator | Description |
| --- | --- |
| Property Indicator | Single Residence, Apartment, or Condominium |
| Building Square Footage | A measure of the livable square footage associated with the residence. |
| Number of Bedrooms | A proxy for the number of occupants |
| Construction Date | The year the building was constructed can point to energy inefficiency |
| Renovation Date | This date would indicate the most recent renovation associated with the residence |
| AC indicator | Whether the residence has a Air Conditioning unit |
| Swimming Pool Indicator | Whether or not the residence has a swimming pool |

Given the residence features, consumption patterns associated with like residences in a particular postal code can be compared, leading to better estimates of distributions of consumption characteristics which provides more reliable estimates of outlier behaviors associated with particular residences. For example, within a ZIP code one can examine how this residence compares with other 3 bedroom, 1500 to 1900 square foot homes, built before 1940, with a swimming pool and with an AC unit. Being able to accurately define peer groups enables an accurate determination of how much of the consumption is anomalous at the residence level. This level of detail also helps address a common consumption pattern to detect anomalous patterns for subscribers in new construction where historical usage patterns at a service address do not exist. For new subscribers within an established service address, usage patterns can be compared against historical patterns from that service address, but enhanced further with the data presented by peers which may indicate a change in characteristics since given a new residency.

Measurements can also be expressed in terms of normalized quantities. For example, at the service address level the consumption can be expressed in terms of KWH/bedroom, KWH/SquareFoot, etc. These normalized variables allow further views into the abnormality associated with the residence based on peer analysis. Table 2 provides an example of how different consumption characteristic distributions are computed at the ZIP code profile level based on relevant residences features.

Further, the distributions and patterns of usage within and across residences and residence segments are updated in real-time rather than being based solely on historical data since factors such as weather or affluence/decline can change over time. These consumption characteristic distributions can be estimated utilizing sequential quantile (or other segment) estimators that are one-pass algorithms that utilize constant memory and require no sorting of exemplars of the characteristics. These techniques are well suited to transaction processing systems where the analytics is restricted to a single pass through the data.

Business Revenue Assurance Monitoring (BRAM) is a special application of the system and methods described herein. Business customers pose unique challenges for the monitoring of utility consumption primarily due to the lack of data associated with peers. Some businesses may resemble one another while others, particularly those classified in large industry, will have unique and changing consumption needs based on production cycle. Monitoring at this level relies more heavily on monitoring the consumption at the service address and monitoring all meters associated with that service address.

There is a deeper acknowledgement that consumption may vary more depending on when and how each electric circuit is used during the production process or during business hours. Postal codes are not a logical way to compare across businesses, so utilization of standard industry codes (SICs) is a more reliable way to group similar business for comparison of

TABLE 2

| Residence built before 1899 | Residence built 1900-1909 | | Residence built 1990-1999 | Residence built 2000-2010 | Non-Specified |
|---|---|---|---|---|---|
| Distribution KiloWatts/month | Distribution KiloWatts/month | ... | Distribution KiloWatts/month | Distribution KiloWatts/month | Distribution KiloWatts/month |
| Distribution KiloWatts/month per bedroom | Distribution KiloWatts/month per bedroom | ... | Distribution KiloWatts/month per bedroom | Distribution KiloWatts/month per bedroom | Distribution KiloWatts/month per bedroom |
| Distribution KiloWatts/month per SqFootage | Distribution KiloWatts/month per SqFootage | ... | Distribution KiloWatts/month per SqFootage | Distribution KiloWatts/month per SqFootage | Distribution KiloWatts/month per SqFootage |
| ... | ... | ... ... | | ... | ... |

Figure 5:
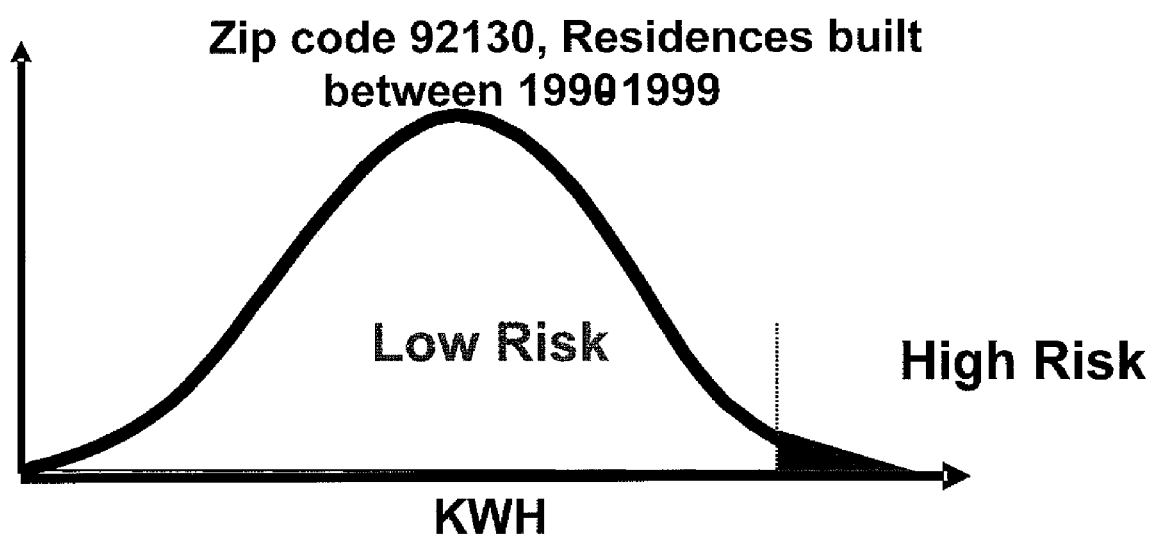
FIG. 5 illustrates a distribution of a utility consumption for a peer grouping.

For each category, a non-specified category can be added to deal with missing feature data associated with the entity if, for example, the build date of a residence is unknown. In the example, comparison of similar features among entities is enabled through the computation of real-time distributions of characteristic values based on residences of similar characteristics in the ZIP code. As shown in FIG. 5, there may be a variety of distributions based on the different features specified for the residence. For instance, Table 2 above may be replicated based on distributions for a number of bedrooms at the residence or square footage ranges of residences within the postal code.

Figure 6:
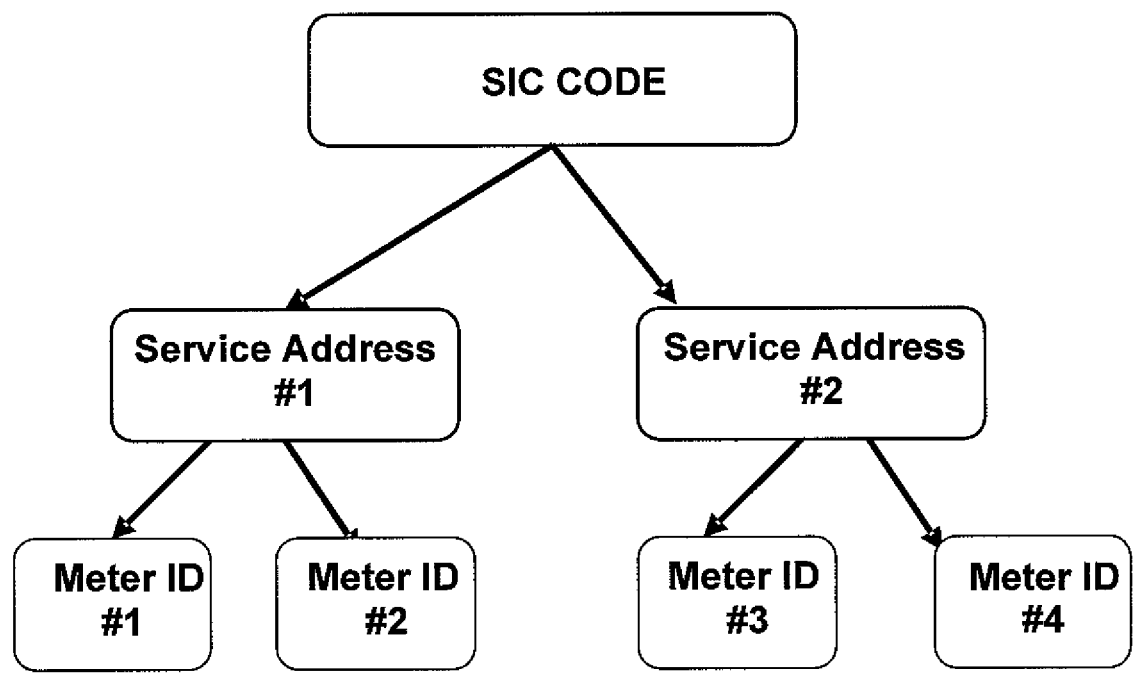
FIG. 6 illustrates a business revenue assurance monitoring hierarchy.

Quantifying the severity of the abnormality in the different segments that describe the entity is important for determining whether consumption is in line with similar entities, i.e. similar customers and similar types of construction for the property example. Also important is to determine whether the consumption for the entity itself is routinely high, low, or variable in nature for those entities that have widely changing consumption patterns. This can point to true abnormalities that can be the result of meter failure/meter tampering vs. normal variations in usage either at a peer level (for example increased consumption by energy inefficient homes during a cold spell) or at the customer level (a frequent traveler).

energy needs across businesses. FIG. 6 below illustrates the profiling points on which to create patterns or profiles of consumption to point to revenue leakage or suspicious changes in consumption behavior. Unfortunately since the SIC provides only a general classification of businesses, the peer analysis is constructed carefully since the size of the business is not reflected directly in the code. In addition, the SIC code, particularly in cases of fraud, may be assigned erroneously to the business.

Revenue leakage is measured based on fluctuations in consumption at the meter and service address. The peer analysis is based on grouping businesses by SIC and accounting for the size of the business through segmentation based on average consumption of the business. The analytic system then compares peer businesses based on where each business lies on average in the distribution of overall utility consumption. For example, if the SIC is 7215 "Coin-Operated Laundries and Dry cleaning" there can be a variety of sizes of businesses ranging from 4 machines to 120 machines, or can have equal number of machines but different operating hours. By monitoring the placement of the business to a particular overall consumption decile, like business are compared based on the overall consumption decile (or other segmentation) to which they commonly belong, which in turn can be a proxy for the different sizes of the businesses. Table 3 shows a comparison of an exemplary business to a distribution of like businesses based on property historical consumption decile ranking.

TABLE 3

| SIC = 7215 Historical Consumption 0-10% | SIC = 7215 Historical Consumption 10-20% | ... | SIC = 7215 Historical Consumption 80-90% | SIC = 7215 Historical Consumption 90-100% |
|---|---|---|---|---|
| Distribution of KiloWatts/month Distribution of ratio of property delta to property variance Distribution Ratio of Consumption this month to last ... | Distribution KiloWatts/month Distribution of ratio of property delta to property variance Distribution Ratio of Consumption this month to last ... | ... ... | Distribution KiloWatts/month Distribution of ratio of property delta to property variance Distribution Ratio of Consumption this month to last ... | Distribution KiloWatts/month Distribution of ratio of property delta to property variance Distribution Ratio of Consumption this month to last ... |

This technique of segmenting provides a means of making meaningful comparisons between businesses with similar usage characteristics. Whether the business is exhibiting revenue leakage is best characterized by changes in its consumption once a placement decile is computed. In addition, by assigning a placement decile to each business, field workers can help validate whether a business with a placement decile of 0-10 is truly much smaller than one with a placement decile of 40-50. If businesses are in fact similar in terms of the number of washers and dryers for two laundry mat businesses belonging to SIC=7215 but belong to very different placement deciles this can point to abnormalities which may indicate fraud or an error with a meter setting, such as an incorrect meter multiplier.

Figure 7:
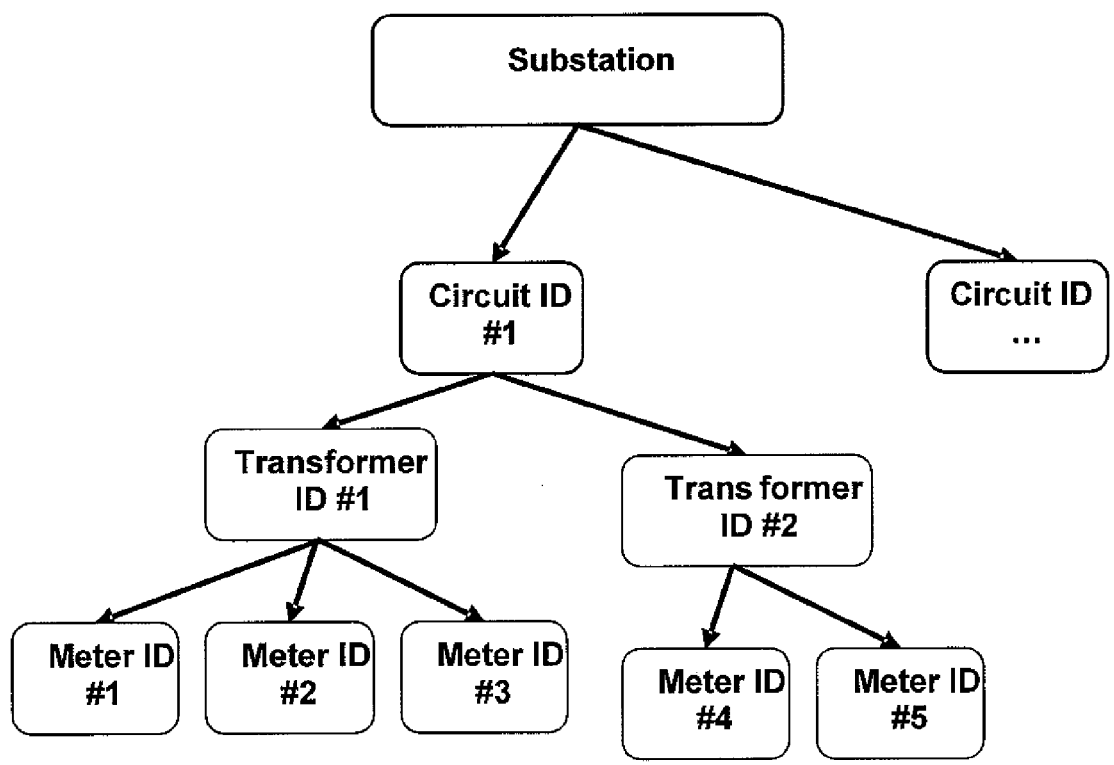
FIG. 7 illustrates a network assurance monitoring topology.

To determine network failure, the network topology is determined and profiled. In the electricity example, the topology can be represented roughly by monitoring the hierarchy of usage distribution from the substation, circuit, transformer, and meter. When changes occur at points in the identified topology, they are recorded and updated. Each of these levels need not be necessarily monitored by a monitoring device to measure the consumption of power at each of these points, as this can be computed in aggregate based on meter reads associated with the hierarchy. FIG. 7 illustrates a network assurance monitoring topology.

Referring back to the electric utility example, the network infrastructure shown in FIG. 7 provides the ability to monitor loads on substations, circuits, and transformers to derive the likelihood of transformer failure or circuit overload. This can be accomplished through monthly measurements of the loads on the transformers and computations of variations in the transformer load based on meter measurements. Changes in consumption can point to variation in load or to an issue such as an un-metered line within new construction. To provide maximum analytic predictive power, descriptions of the transformers such as age, equipment type, and the rated capacity of transformers can provide additional load characteristics that can indicate that under excessive load a transformer may overheat which over extended time periods can lead to transformer failure.

Once the appropriate features of the transformer are determined, the same peer analysis based on distributions of load features are utilized to point to transformers that exhibit extreme load characteristics based on load measurements of similar equipment deployed in the electrical grid. As shown in Table 4 below, each transformer load characteristic is compared to the distributions of load characteristics of similar equipment. For example, it can be determined whether a particular transformer is exhibiting loads at the 99% percentile of similar transformer types. Other questions that can be answered include: has the transformer always been at the top 99% ranking or is the monthly change in its ranking excessive. A transformer that ranked at the 99% percentile of transform load and showed a 1% change in its ranking may be less risky for failure than a transformer that is ranked at a 98% load but has shown a 14% change in its ranking.

There are also other measures that can be utilized to determine variations such as the ratio of current load to average load on the transformer or the monthly load compared to the monthly load 12 months ago. The value of these load characteristics to determine network failures rely upon real-time determinations of the distribution of load characteristics of like transformers to determine whether a particular transformer is exhibiting outlier behavior.

TABLE 4

| Transformer Equipment Type 1 | Transformer Equipment Type 2 | Transformer Equipment Type N-1 | Transformer Equipment Type N |
|---|---|---|---|
| Distribution KiloWatts/month Monthly Change in Distribution Ranking Ratio of Distribution Ranking to Average Distribution over 3 months | Distribution KiloWatts/month Monthly Change in Distribution Ratio of Distribution Ranking to Average Distribution over 3 months | Distribution KiloWatts/month Monthly Change in Distribution Ratio of Distribution Ranking to Average Distribution over 3 months | Distribution KiloWatts/month Monthly Change in Distribution Ratio of Distribution Ranking to Average Distribution over 3 months |

TABLE 4-continued

| Transformer Equipment Type 1 | Transformer Equipment Type 2 | Transformer Equipment Type N-1 | Transformer Equipment Type N |
|---|---|---|---|
| Ratio of Measured load to Variance of load on Transformer | Ratio of Measured load to Variance of load on Transformer | Ratio of Measured load to Variance of load on Transformer | Ratio of Measured load to Variance of load on Transformer |
| ... | ... | ... | ... |

Similar techniques can be applied at the circuit-level or substation level. This analysis can be more difficult since circuits may be changed over the course of time based on response to consumer electrical needs resulting in more or less meters associated with the circuit at any time. There are methods to monitor these changes, but these methods require detailed topology change notification.

In addition to monitoring load characteristics, information regarding equipment that is replaced either due to failure or routine replacement of transformers, can be monitored by the system to provide additional information about the likelihood of future failure. For example, the number of service calls associated with different transformer types can be profiled to determine whether a particular transformer shows a high probability of wear or failure and should thus be replaced to prevent network failure. This is done via feedback loops based on technician calls. The technique also applies to new untested equipment placed in the field.

TABLE 5

| Transformer Equipment Type 1 | Transformer Equipment Type 2 | Transformer Equipment Type N-1 | Transformer Equipment Type N |
|---|---|---|---|
| Proportion of failed equipment to total in the last 30 days Proportion of replaced equipment to total in the last 30 days Transformer load characteristics at time of transformer failure | Proportion of failed equipment to total in the last 30 days Proportion of replaced equipment to total in the last 30 days Transformer load characteristics at time of transformer failure | Proportion of failed equipment to total in the last 30 days Proportion of replaced equipment to total in the last 30 days Transformer load characteristics at time of transformer failure | Proportion of failed equipment to total in the last 30 days Proportion of replaced equipment to total in the last 30 days Transformer load characteristics at time of transformer failure |
| ... | ... | ... | ... |

Table 5 above illustrates that based on service calls associated with equipment failure or equipment updating; one can couple whether the load characteristics associated with the transformer are abnormal, whether a transformer's load characteristics resemble other of the same equipment type at time of failure and statistics on the probability of failure based on equipment failure rates. This provides another methodology to bring real-time reliability data of the equipment based on field investigation into the analytic decisioning of what equipment will be next to fail and should consequently be replaced to avoid said failure and resulting revenue leakage issues.

Highlighting these scenarios of when failure is likely to occur and where load-balancing issues exists can enable a utility to strengthen their network planning processes and reduce overall operating expenditures.

Some or all of the functional operations described in this specification can be implemented in digital electronic circuitry, or in computer software, firmware, or hardware, including the structures disclosed in this specification and their structural equivalents, or in combinations of them.

Embodiments of the invention can be implemented as one or more computer program products, i.e., one or more modules of computer program instructions encoded on a computer readable medium, e.g., a machine readable storage device, a machine readable storage medium, a memory device, or a machine-readable propagated signal, for execution by, or to control the operation of, data processing apparatus.

The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of them. A propagated signal is an artificially generated signal, e.g., a machine-generated electrical, optical, or electromagnetic signal, that is generated to encode information for transmission to suitable receiver apparatus.

A computer program (also referred to as a program, software, an application, a software application, a script, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for executing instructions and one or more memory devices for storing instructions and data. Generally, a computer will also include, or be operatively coupled to, a communication interface to receive data from or transfer data to, or both, one or more mass storage devices for storing data, e.g., magnetic, magneto optical disks, or optical disks.

Moreover, a computer can be embedded in another device, e.g., a mobile telephone, a personal digital assistant (PDA), a mobile audio player, a Global Positioning System (GPS) receiver, to name just a few. Information carriers suitable for embodying computer program instructions and data include all forms of non volatile memory, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the invention can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

Embodiments of the invention can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the invention, or any combination of such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

Certain features which, for clarity, are described in this specification in the context of separate embodiments, may also be provided in combination in a single embodiment. Conversely, various features which, for brevity, are described in the context of a single embodiment, may also be provided in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Particular embodiments of the invention have been described. Other embodiments are within the scope of the following claims. For example, the steps recited in the claims can be performed in a different order and still achieve desirable results. In addition, embodiments of the invention are not limited to database architectures that are relational; for example, the invention can be implemented to provide indexing and archiving methods and systems for databases built on models other than the relational model, e.g., navigational databases or object oriented databases, and for databases having records with complex attribute structures, e.g., object oriented programming objects or markup language documents. The processes described may be implemented by applications specifically performing archiving and retrieval functions or embedded within other applications.

The invention claimed is:

1. A computer-implemented method for detecting anomalies of a utility distribution system, the method comprising:
receiving, through a communications network, utility metering data obtained at a utility meter of a plurality of network elements characterizing a network topology, the plurality of network elements comprising a plurality of meters including the utility meter, a plurality of transformers, a plurality of circuits, and at least one substation;
measuring, based on the utility metering data, a utility consumption associated with an entity, the entity being a physical property; and
monitoring the utility consumption for an anomaly based on entity profile characteristics associated with the entity, the monitoring comprising computing real-time values of utility consumption characteristics of at least one peer grouping including a plurality of entities with similar entity profile characteristics, the plurality of entities including the entity, the at least one peer grouping comprising one or more peers of the entity, the at least one peer grouping being refined when new data associated with the utility consumption is received, the monitoring comprising comparing the real-time values of the at least one peer grouping with the utility consumption associated with the entity to determine the anomaly, the at least one peer grouping being refined by executing a plurality of weighting algorithms on updated peer profile data associated with the entity, the utility consumption characteristics comprising a ratio of current load on a transformer of the plurality of transformers to an average load on the transformer during a predetermined period of time, the monitoring comprising determining changes in the network topology, the monitoring being further based on patterns of utility consumption of the entity, the patterns being updated in real-time.

2. A method in accordance with claim 1, wherein:
the monitoring further comprises comparing the utility consumption associated with the entity to one or more peer profiles associated with the entity; and
the monitoring is based on at least one of a construction date and renovation date associated with the entity.

3. A method in accordance with claim 2, further comprising generating one or more peer groupings based on the one or more peer profiles associated with the entity.

4. A method in accordance with claim 3, further comprising linking the utility consumption associated with the entity to at least one of the one or more peer groupings.

5. A method in accordance with claim 3, further comprising:
receiving the updated peer profile data associated with the entity before the refining using the plurality of weighting algorithms.

6. A method in accordance with claim 2, further comprising normalizing the utility consumption associated with an entity based on the entity profile characteristics and peer profiles associated with the entity.

7. A method in accordance with claim 1, wherein the entity profile characteristics associated with the entity comprise: a postal code of the physical property, a square footage size of the physical property, a number of bedrooms in the physical property, whether the physical property includes a pool, and standard industry codes associated with the physical property.

8. A method in accordance with claim 1, wherein the utility consumption associated with an entity characterizes an amount of gas and water used at the physical property.

9. A method in accordance with claim 1, wherein the monitoring further comprises determining fluctuations based on weather patterns, daylight savings, and affluence of a particular neighbourhood of the physical property.

10. A utility analytics system comprising:
an analytics computer adapted to receive utility metering data obtained at a utility meter of a plurality of network elements characterizing a network topology, the plurality of network elements comprising at least a transformer, the analytics computer adapted to measure a utility consumption associated with an entity based on the utility metering data, and to monitor the utility consumption for one or more anomalies based on entity profile characteristics associated with the entity, the monitoring comprising computing real-time values of utility consumption characteristics of at least one peer grouping that includes a plurality of entities having similar profile characteristics, and comparing the real-time values of the at least one peer grouping with the utility consumption associated with the entity, the at least one peer grouping being refined by executing a plurality of weighting algorithms on updated peer profile data associated with the entity, the utility consumption characteristics comprising a ratio of a monthly load on the transformer of the plurality of transformers to an average load on the transformer, the monitoring accounting for changes in the network topology, the at least one peer grouping being modified when new data associated with the utility consumption is received in real-time, the monitoring being further based on data presented by one or more peers of the entity, the data presented by the one or more peers indicating a change in the entity profile characteristics associated with the entity, the monitoring being further based on patterns of utility consumption of the entity, the patterns being updated in real-time.

11. A system in accordance with claim 10, wherein the analytics computer is further adapted to compare the utility consumption associated with the entity to one or more peer profiles associated with the entity.

12. A system in accordance with claim 11, wherein the analytics computer is further adapted to generate one or more peer groupings based on the one or more peer profiles associated with the entity.

13. A system in accordance with claim 12, further comprising a database accessible by the analytics computer for storing the utility consumption, entity profile characteristics, and one or more peer profiles.

14. A system in accordance with claim 10, wherein the analytics computer includes a server adapted to transmit analytics result data to one or more analytics result data consumer computers.

15. A system in accordance with claim 12, wherein the analytics computer is further adapted to:
receive the updated peer profile data associated with the entity.

16. A system in accordance with claim 10, further comprising a communications network connected with the analytics computer over which the analytics computer receives the utility metering data.

17. A method for detecting anomalies of a utility system, the method comprising:
monitoring utility metering data obtained at one or more utility meters of a plurality of network elements forming a network topology, the network elements comprising at least a transformer, the monitoring comprising computing real-time values of utility consumption characteristics of at least one peer grouping comprising a plurality of entities having similar entity profile characteristics, and comparing the real-time values of the at least one peer grouping with a utility consumption associated with at least one entity of the plurality of entities to determine whether the at least one entity is anomalous, the at least one peer grouping being refined by executing a plurality of weighting algorithms on updated peer profile data associated with the entity, the utility consumption characteristics comprising a ratio of current load on the transformer to an average load on the transformer, the one or more entities comprising one or more physical properties, the monitoring comprising determining changes in the network topology, the at least one peer grouping being modified when new data associated with the utility consumption is received in real-time;
transmitting the utility metering data through a communications network to an analytics computer; and
generating, using the analytics computer, utility consumption data patterns of utility consumption data for the one or more entities based on the utility metering data, the utility consumption data patterns being enhanced using data presented by one or more peers of the one or more entities, the utility consumption data patterns being updated in real-time.

18. A method in accordance with claim 17, further comprising monitoring, using the analytics computer, the utility consumption data to detect an anomaly in the utility system.

19. A method in accordance with claim 18, wherein the monitoring further includes associating the utility consumption data with entity profile characteristics associated with the entity.

20. A method in accordance with claim 18, wherein the monitoring further comprises comparing the utility consumption data to one or more peer profiles associated with the entity.

21. A method in accordance with claim 20, further comprising generating, with the analytics computer, one or more peer groupings based on the one or more peer profiles associated with the entity.

* * * * *